(12) United States Patent
Nejad

(10) Patent No.: US 6,791,870 B2
(45) Date of Patent: Sep. 14, 2004

(54) MAGNETORESISTIVE MEMORY DEVICES AND ASSEMBLIES; AND METHODS OF STORING AND RETRIEVING INFORMATION

(75) Inventor: Hasan Nejad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/418,406

(22) Filed: Apr. 18, 2003

(65) Prior Publication Data

US 2003/0205726 A1 Nov. 6, 2003

Related U.S. Application Data

(62) Division of application No. 10/051,679, filed on Jan. 16, 2002.

(51) Int. Cl.[7] .......................... G11C 11/00; H01L 21/00; H01L 31/119
(52) U.S. Cl. ........................ 365/158; 365/171; 365/173; 438/3; 257/295
(58) Field of Search ................................. 365/158, 171, 365/173; 438/3, 48; 257/295, 421–427

(56) References Cited

U.S. PATENT DOCUMENTS

| 6,055,179 A | * | 4/2000 | Koganei et al. ............ 365/158 |
| 6,097,625 A | | 8/2000 | Scheuerlein |
| 6,188,615 B1 | | 2/2001 | Perner et al. |
| 6,215,707 B1 | | 4/2001 | Moyer |
| 6,272,041 B1 | | 8/2001 | Naji |
| 6,381,170 B1 | * | 4/2002 | Prinz .......................... 365/171 |
| 2001/0026471 A1 | | 10/2001 | Michijima et al. |
| 2001/0038548 A1 | | 11/2001 | Perner et al. |
| 2002/0037595 A1 | * | 3/2002 | Hosotani ........................ 438/3 |

FOREIGN PATENT DOCUMENTS

| EP | 1 085 586 A2 | 3/2001 |
| EP | 1 143 537 A1 | 10/2001 |
| WO | US 03 / 00120 | 2/2003 |

\* cited by examiner

Primary Examiner—David Nelms
Assistant Examiner—Long Tran
(74) Attorney, Agent, or Firm—Wells St. John P.S.

(57) ABSTRACT

The invention includes a magnetoresistive memory device having a memory bit stack. The stack includes a first magnetic layer, a second magnetic layer, and a non-magnetic layer between the first and second magnetic layers. A first conductive line is proximate the stack and configured for utilization in reading information from the memory bit. The first conductive line is ohmically connecting with either the first or second magnetic layer. A second conductive line is spaced from the stack by a sufficient distance that the second conductive line is not ohmically connected to the stack, and is configured for utilization in writing information to the memory bit. The invention also includes methods of storing and retrieving information.

14 Claims, 1 Drawing Sheet

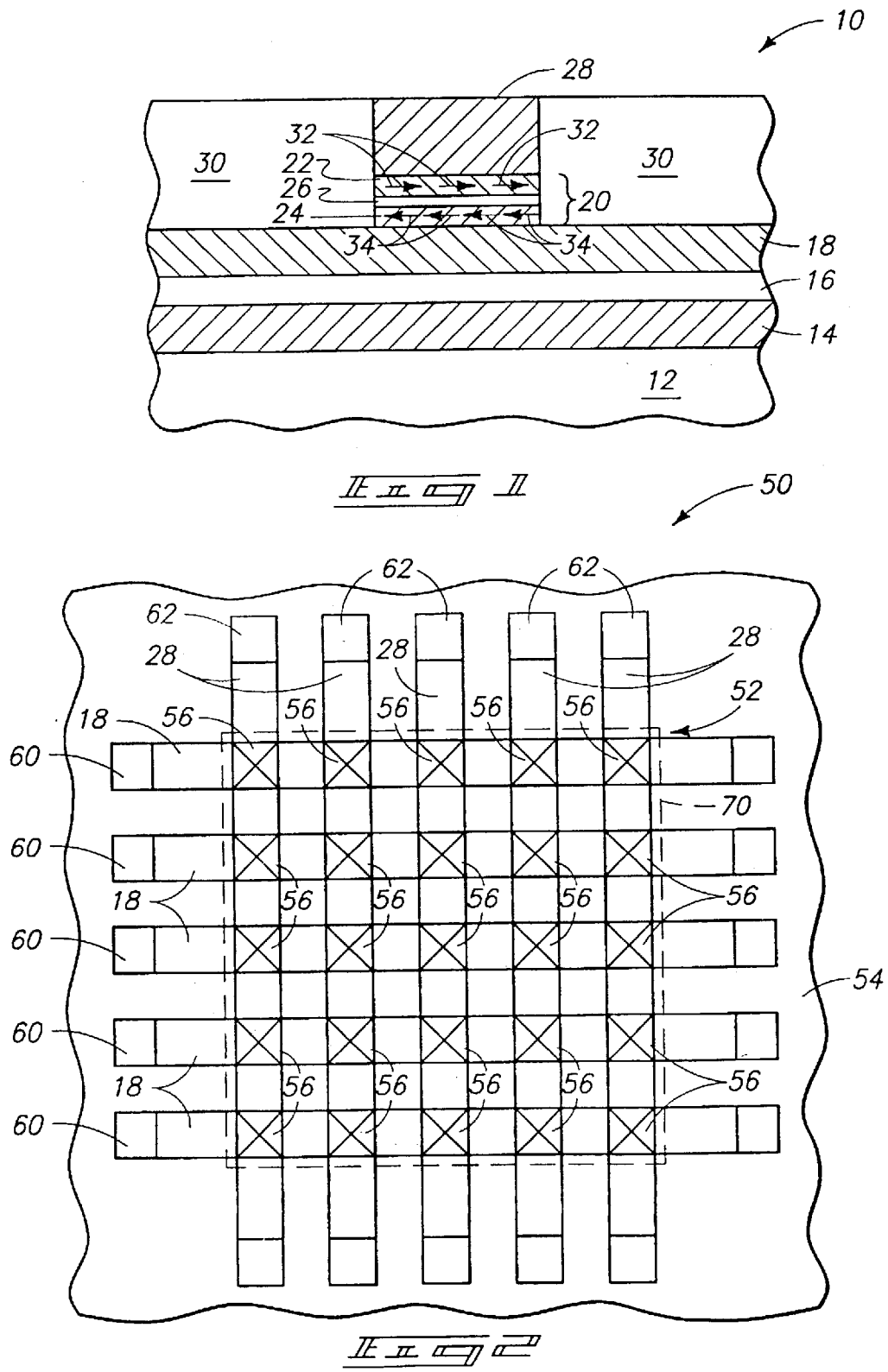

MAGNETORESISTIVE MEMORY DEVICES AND ASSEMBLIES; AND METHODS OF STORING AND RETRIEVING INFORMATION

RELATED PATENT DATA

This patent resulted from a divisional application of U.S. patent application Ser. No. 10/051,679, filed Jan. 16, 2002.

TECHNICAL FIELD

The invention pertains to magnetoresistive memory devices, such as, for example, magnetic random access memory (MRAM) devices, and also pertains to methods of storing and retrieving information.

BACKGROUND OF THE INVENTION

Numerous types of digital memories are utilized in computer system components, digital processing systems, and other applications for storing and retrieving data. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the memory devices. It is noted that the term "magnetoresistive device" characterizes the device and not the access device, and accordingly a magnetoresistive device can be accessed by, for example, either inductive sensing or magnetoresistive sensing methodologies.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on electric charge storage within capacitors. Such capacitors leak electric charge, and must be refreshed at approximately 64–128 millisecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices will remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop improved MRAM devices.

SUMMARY OF THE INVENTION

In one aspect, the invention encompasses a magnetoresistive memory device. The device includes a memory bit which comprises a stack having a first magnetic layer, a second magnetic layer, and a non-magnetic layer between the first and second magnetic layers. A first conductive line is proximate the stack and configured for utilization in reading information from the memory bit. A second conductive line is spaced from the stack by a greater distance than the first conductive line is spaced from the stack, and is configured for utilization in writing information to the memory bit.

In one aspect, the invention encompasses a magnetoresistive memory device assembly. The assembly includes an array of individual magnetoresistive memory devices. The devices include memory bits. The individual memory bits comprise a stack of a pair of magnetic layers separated by a non-magnetic layer. A first conductive line is proximate the stack and utilized for reading information from the memory bit. A second conductive line is spaced from the stack by a greater distance than the first conductive line and is configured for utilization in writing information to the memory bit. The first conductive line extends across a first set of several of the individual magnetoresistive memory devices of the array, and the second conductive line also extends across the first set of the individual magnetoresistive memory devices of the array. A first transistor is electrically connected with the first conductive line and accordingly electrically connected with the first set of individual magnetoresistive memory devices. Additionally, a second transistor is electrically connected with the second conductive line, and accordingly electrically connected with the first set of the individual magnetoresistive memory devices of the array.

In one aspect, the invention encompasses a method of storing and retrieving information. A magnetoresistive memory device is provided. The device comprises a memory stack having a pair of magnetic layers separated by a non-magnetic layer. A first conductive line is provided proximate the stack and utilized for reading information from the memory bit, and a second conductive line is spaced from the stack by a greater distance than the first conductive line and utilized for writing information to the memory bit. The first conductive line is operated at a maximum amperage of from about 500 nanoamps to about 1 microamp during reading of information from the memory bit, and the second conductive line is operated at a maximum amperage of from about 1 milliamp to about 10 milliamps during writing of information to the memory bit.

BRIEF DESCRIPTION OF THE DRAWINGS

Preferred embodiments of the invention are described below with reference to the following accompanying drawings.

FIG. 1 is a diagrammatic, cross-sectional view of an exemplary magnetoresistive memory device encompassed by the present invention.

FIG. 2 is a diagrammatic top view of a fragment of a magnetoresistive memory device assembly illustrating an exemplary application of the present invention.

DETAILED DESCRIPTION OF THE PREFERRED EMBODIMENTS

In one aspect, the invention pertains to a novel MRAM device exemplified by a construction 10 in FIG. 1. Construction 10 includes a substrate 12. Substrate 12 can comprise, for example, monocrystalline silicon having various circuit elements (not shown) formed thereover. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically conductive line 14 is supported by substrate 12, an electrically insulative layer 16 is over line 14, and an electrically conductive line 18 is over electrically insulative layer 16. In the discussion and claims that follow, conductive line 18 can be referred to as a first conductive line, and conductive line 14 can be referred to as a second conductive line. Conductive lines 14 and 18 can comprise any of numerous conductive materials, including, for example, metals, metal compositions, and conductively-doped semiconductive materials. Insulative layer 16 can comprise any of numerous electrically insulative materials, including, for example, silicon dioxide, silicon nitride, and/ or so-called low-k materials.

A memory bit 20 is over conductive line 18, and comprises a stack which includes a first magnetic layer 22, a second magnetic layer 24, and a non-magnetic material 26 between magnetic layers 22 and 24. Magnetic layers 22 and 24 of memory bit 20 typically comprise one or more of nickel, iron, cobalt, iridium, manganese, platinum and ruthenium. The non-magnetic material 26 can comprise either an electrically conductive material (such as copper) in applications in which the MRAM is to be a giant magnetoresistive (GMR) device, or can comprise an electrically insulative material (such as, for example, aluminum oxide ($Al_2O_3$) or silicon dioxide), in applications in which the MRAM device is to be a tunnel magnetoresistive (TMR) device. Magnetic layer 24 physically contacts conductive line 18 in the shown embodiment.

A third conductive line 28 is provided over the memory bit, and extends in an orthogonal orientation relative to first and second conductive lines 18 and 14. Accordingly, third conductive line 28 extends into and out of the page in the shown orientation of construction 10. Conductive line 28 can comprise any of numerous conductive materials, including, for example, metals and metal compositions. Conductive line 28 physical contacts magnetic layer 22 in the shown embodiment.

An electrically insulative material 30 is provided along sidewalls of conductive line 28 and memory bit 20, as well as over a top of second conductive line 18. Insulative material 30 can comprise any of numerous electrical insulative materials, including, for example, silicon dioxide, silicon nitride, and borophosphosilicate glass (BPSG).

The magnetic layers 22 and 24 each contain a magnetic moment therein, and in FIG. 1 the magnetic moment within layer 22 is illustrated by arrows 32 while the magnetic moment in layer 24 is illustrated by arrows 34. Information is stored in memory bit 20 as a relative orientation of the magnetic moment in layer 22 relative to the magnetic moment in layer 24. In the shown construction, the magnetic moments are anti-parallel to one another. Another stable orientation of the magnetic moments in layers 22 and 24 is one in which the moments are parallel to one another.

Information can be stored within bit 20 by considering the anti-parallel orientation of the magnetic moments to correspond to either a "0" or "1" in a two-state memory device, and the parallel orientation to correspond to the other of the "0" and "1".

Typically, one of the magnetic layers 22 and 24 has its magnetic orientation pinned within it, so that such orientation does not change during storage and retrieval of information from the memory bit. The other of the magnetic layers has an orientation which is changed during at least the writing of information to the memory bit. Accordingly, an exemplary memory bit can have the shown magnetic orientation within layer 22 fixed, while the orientation within layer 24 is varied from a parallel to anti-parallel state as information is stored within the memory bit.

Conductive lines 14, 18 and 28 are utilized for reading and writing of information relative to memory bit 20. More specifically, conductive line 14 is utilized for writing of information to memory bit 20; conductive line 18 is utilized for reading of information from memory bit 20; and conductive line 28 is a common line utilized for both the reading and writing operations in preferred embodiments. One aspect of particular embodiments of the present invention is a recognition that a conductive line utilized in a reading operation relative to memory bit 20 (the line 18 of FIG. 1) should be in ohmic electrical contact with the bit to allow sensing of a memory state of the bit (i.e. the relative magnetic orientations within layers 22 and 24).

Another aspect of particular embodiments of the invention is recognition that the conductive line utilized for writing information to memory bit 20 is preferably not in ohmic electrical contact with the bit. In particular aspects, the conductive line utilized for a writing operation (line 14 of the shown construction) is provided close enough to bit 20 so that a magnetic field from the write line 14 overlaps sufficiently with the bit to switch a memory state of the bit (specifically, to switch a magnetic orientation within one of layers 22 and 24), but the line is too far from the bit for ohmic electrical contact with the bit.

In the shown construction, conductive line 14 is separated from memory bit 20 by a combined thickness of conductive line 18 and insulative material 16. In particular embodiments, layer 18 will have a thickness of from about 100 Angstroms to about 300 Angstroms, and layer 16 will have a thickness of at least about 100 Angstroms, so that conductive material 14 is separated from bit 20 by a distance of at least about 200 Angstroms. It is noted that other intervening materials can be provided between layer 14 and memory bit 20 in addition to, or alternatively to, the shown materials of layers 16 and 18.

While it is possible in theory to accomplish a writing operation to memory bit 20 utilizing conductive line 14 alone, such is difficult in practice due to physics of attempting to induce a full flip in magnetic orientation of one of layers 22 and 24 from a single conductive line. Specifically, any defects or inhomogeneities in a magnetic material can cause the magnetic moment to be less than fully flipped, and accordingly a stable orientation will not be achieved. The magnetic moment can then flip back to the original orientation, rather than achieving the new orientation desired by the write operation. Conductive line 28 can simplify the writing operation. Specifically, if current is flowed through conductive line 28 a magnetic orientation can be flipped half-way toward a desired magnetic orientation, and subsequent current flow through line 14 can readily completely flip the magnetic orientation to the desired orientation. The utilization of a conductive line on top of an MRAM memory bit, and orthogonal to a conductive line utilized for writing to the bit, is typically referred to as a half-select process.

Conductive line 28 can also be utilized in reading information from memory bit 20, and will provide an electrical contact on the opposite side of the bit for a reading operation.

The relative amperages provided through conductive lines 14, 18 and 28 can be tailored for the particular operations that the lines are utilized in. Accordingly, a maximum amperage within conductive line 18 (which is utilized solely for reading operations) can be maintained at a level of from about 500 nanoamps to about 1 microamp. In contrast, the maximum amperage within conductive line 14 (utilized in write operations) can be maintained at a level of from about 1 milliamp to about 10 milliamps. Additionally, a maximum amperage within conductive line 28 can be maintained to a level of from about 1 milliamp to about 10 milliamps.

Conductive lines 14, 18 and 28 can comprise materials suitable for carrying the maximum amperages desired in the conductive lines. Accordingly, conductive line 18 can comprise numerous conductive materials suitable for carrying relatively low amperages, including, for example, various metals, metal silicides, and conductively doped semiconductive materials, including conductively doped silicon. Conductive lines 14 and 28 can comprise numerous materials suitable for carrying relatively high amperages, including, for example, various metals.

In an exemplary application of the present invention, memory bits of the type described with reference to FIG. 1 are incorporated into a memory array. An exemplary assembly 50 comprising an array of memory bits is illustrated in FIG. 2, with the array generally designated by the numeral 52. Assembly 50 comprises a substrate 54 supporting the array 52. Substrate 54 can comprise the materials described above with reference to substrate 12. Individual memory bits 56 are shown within array 52, and designated by "X". The memory bits can comprise the magnetic layers 22 and 24, and non-magnetic layer 26 described above with reference to FIG. 1.

A plurality of conductive lines 18 are shown crossing through array 52 along a horizontal direction, and a second plurality of conductive lines 28 are shown crossing through array 52 along a vertical direction. Conductive lines 18 and 28 correspond to the lines designated by the same numbers in FIG. 1. It is noted that there is no conductive line visible in FIG. 2 that corresponds to the line 14 of FIG. 1. Such conductive line would, in typical embodiments, be under the conductive line 18, and accordingly not be visible in the view of FIG. 2.

Each of the conductive lines 18 extends across a set of individual memory bits 56 of the array 52. In the shown construction, each line 18 extends across a set of five memory bits of the array. Similarly, each of the lines 28 extends across a set of five memory bits of the array. Further, a buried line corresponding to the line 14 of FIG. 1, and accordingly utilized for writing to the memory bits, will extend across the same set of five memory bits as does the shown line 18.

Each of the lines 18 and 28 has circuitry associated therewith for controlling electrical flow through the lines. Such circuitry is designated with boxes 60 along lines 18, and with boxes 62 along lines 28. The circuitry will typically include at least one transistor, and will be utilized for, among other things, maintaining a maximum amperage through the conductive lines within a desired range. Additionally, the lines 14 (not shown in FIG. 2) will also have circuitry associated therewith similar to the circuitry illustrated relative to line 18, and utilized for controlling flow of electricity through the lines 14; including, for example, maintaining a maximum amperage within line 14 to within a desired range.

The array 52 of memory bits 56 comprises a footprint over substrate 54 which is designated approximately by a dashed line 70 extending around an outer periphery of the array. The circuitry 60 and 62 associated with conductive lines 18 and 28, as well as circuitry (not shown) associated with conductive line 14, is peripheral to the footprint of such array. Preferably, no transistors are provided within the footprint of the array in order to simplify fabrication of the array and densify the number of bits in the fixed array area.

The number of memory bits within array 52 can vary depending on the desired application for the array. In particular embodiments, the array will comprise a matrix having 10 rows of bits and 10 columns of bits (a 10×10 matrix of memory bits), and accordingly will comprise 100 memory bits. In another embodiment, the array will comprise a 100×100 matrix of memory bits, and will accordingly comprise 10,000 memory bits. In yet another embodiment, the array will comprise a 1,000×1,000 matrix of memory bits, and accordingly will comprise 1,000,000 memory bits. In particular applications there will be no circuit elements within the footprint 70 other than memory bits and conductive lines extending between the memory bits, in order to simplify fabrication of the array.

Prior art MRAM constructions typically utilized a single line in ohmic electrical contact with a memory bit for both reading and writing operations (i.e., would utilize the line 18 of FIG. 1 for both read and write operations), and difficulties were encountered during writing operations in that breakdown voltages of the barriers in tunnel junctions of the bits would be exceeded. One aspect of the prior art problem was that a low voltage was utilized in transistors associated with a writing operation, which caused the transistors to be operated in the deep linear region of the transistor current-voltage curve with low drive currents. One aspect of the present invention is to utilize a half-select isolated write conductor. The electrical isolation of the write conductor from the memory bit allows the transistors associated with the conductor to be operated in a saturated region, and consequently can reduce transistor width by at least 10 fold relative to prior art constructions. Since approximately 30% to 40% of the die area associated with an MRAM assembly is typically occupied by write transistors, the reduction of the size of the transistors can decrease the die size substantially.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of storing and retrieving information, comprising:

providing a magnetoresistive memory device, comprising:

a memory bit comprising a stack which includes a first magnetic layer, a second magnetic layer, and a non-magnetic layer between the first and second magnetic layers; the memory bit storing information as a relative orientation of a magnetic moment in the first magnetic layer to a magnetic moment in the second magnetic layer;

a first conductive line proximate the stack and configured for utilization in reading information from the memory bit; and a second conductive line spaced from the stack by a greater distance than the first conductive line is spaced from the stack, and configured for utilization in writing information to the memory bit;

operating the first conductive line at a maximum amperage of from about 500 nanoamps to about 1 microamp during reading of information from the memory bit; and operating the second conductive line at a maximum amperage of from about 1 milliamp to about 10 milliamps during writing of information to the memory bit.

2. The method of claim 1 further comprising:

providing a third conductive line proximate the stack; the third conductive line being configured for utilization in both writing information to the memory bit and reading information from the memory bit; and operating the third conductive line at a maximum amperage of from about 1 milliamp to about 10 milliamps during reading of information from the memory bit and writing of information to the memory bit.

3. The method of claim 1 wherein the memory bit is part of an array of memory bits comprising a footprint over a substrate; wherein the first conductive line extends across several of the memory bits of the array; wherein the reading of information from the several memory bits comprises controlling flow of electricity along the first conductive line with one or more circuit elements; and wherein all of said one or more circuit elements are peripheral to the footprint of the array.

4. The method of claim 3 wherein the array comprises at least 100 memory bits.

5. The method of claim 3 wherein the array comprises at least 10,000 memory bits.

6. The method of claim 3 wherein the array comprises at least 1,000,000 memory bits.

7. The method of claim 1 wherein the memory bit is part of an array of memory bits comprising a footprint over a substrate; wherein the second conductive line extends across several of the memory bits of the array; wherein the writing of information to the several memory bits comprises controlling flow of electricity along the second conductive line with one or more circuit elements; and wherein all of said one or more circuit elements are peripheral to the footprint of the array.

8. The method of claim 7 wherein the array comprises at least 100 memory bits.

9. The method of claim 7 wherein the array comprises at least 10,000 memory bits.

10. The method of claim 7 wherein the array comprises at least 1,000,000 memory bits.

11. The method of claim 1 wherein the memory bit is part of an array of memory bits comprising a footprint over a substrate; wherein the third conductive line extends across several of the memory bits of the array; wherein the reading and writing of information to the several memory bits comprises controlling flow of electricity along the third conductive line with one or more circuit elements; and wherein all of said one or more circuit elements are peripheral to the footprint of the array.

12. The method of claim 11 wherein the array comprises at least 100 memory bits.

13. The method of claim 11 wherein the array comprises at least 10,000 memory bits.

14. The method of claim 11 wherein the array comprises at least 1,000,000 memory bits.

* * * * *